United States Patent [19]

Gasparaitis et al.

[11] Patent Number: 4,490,813

[45] Date of Patent: Dec. 25, 1984

[54] FREQUENCY DETERMINING APPARATUS FOR A SYNTHESIZED RADIO

[75] Inventors: Bernard V. Gasparaitis, Tamarac; Larry M. Krieg; Richard R. Schweet; William R. Williams; Raymond W. Burbank, all of North Lauderdale, all of Fla.

[73] Assignee: Motorola, Inc., Schaumburg, Ill.

[21] Appl. No.: 353,728

[22] Filed: Mar. 1, 1982

[51] Int. Cl.³ .............................................. G11C 13/00
[52] U.S. Cl. ...................................... 365/63; 365/230
[58] Field of Search ................... 365/63, 104, 230, 189

[56] References Cited

U.S. PATENT DOCUMENTS 3,395,318 2/1967 Laermer et al. .
3,646,399 3/1970 Mars et al. .

Primary Examiner—Terrell W. Fears
Attorney, Agent, or Firm—Joseph T. Downey; James W. Gillman; Edward M. Roney

[57] ABSTRACT

Apparatus is provided for containing information designating the frequency of operation of a synthesized radio frequency receiver. The apparatus is programmable and selectively addressable with respect to operating frequency.

12 Claims, 8 Drawing Figures

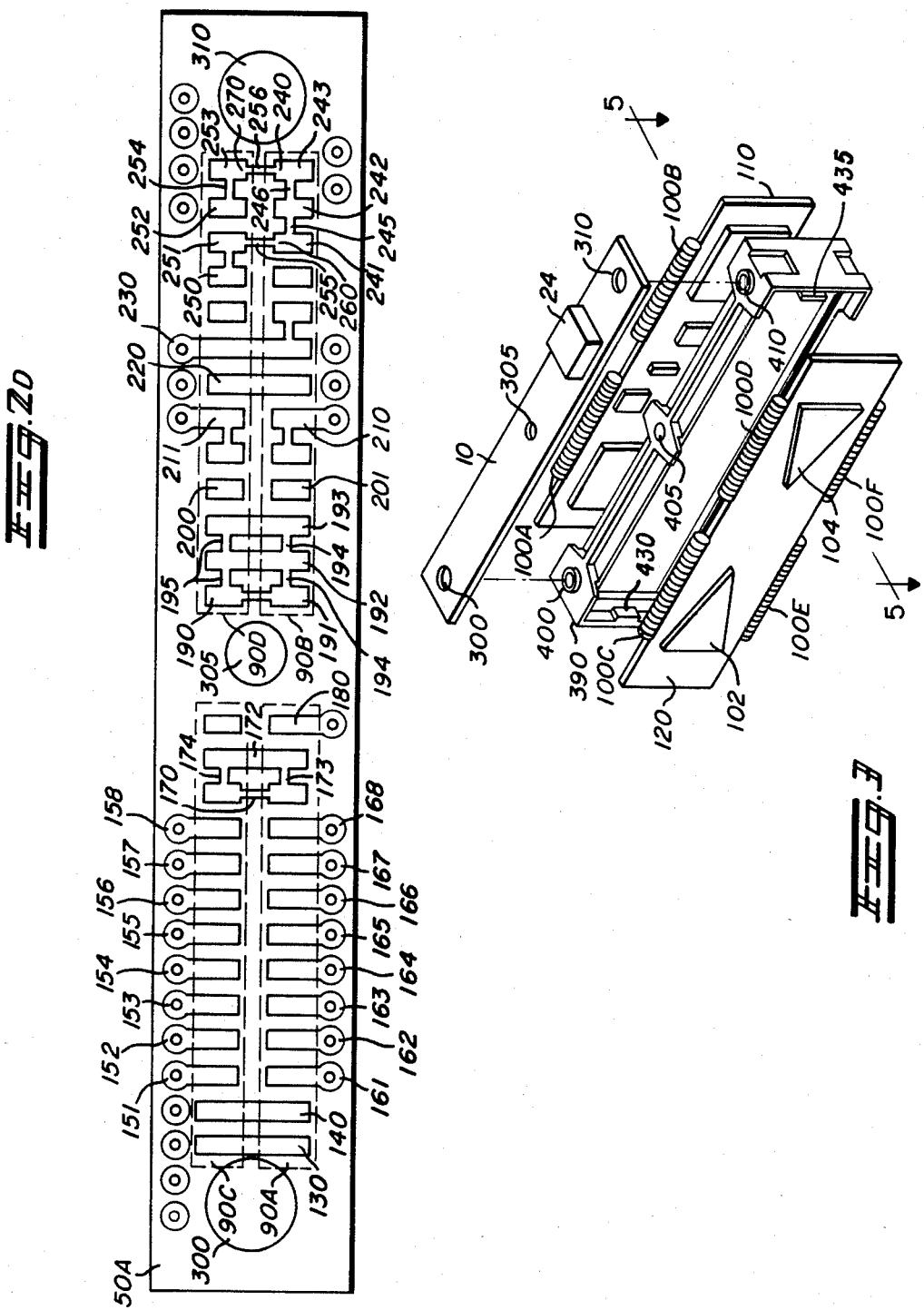

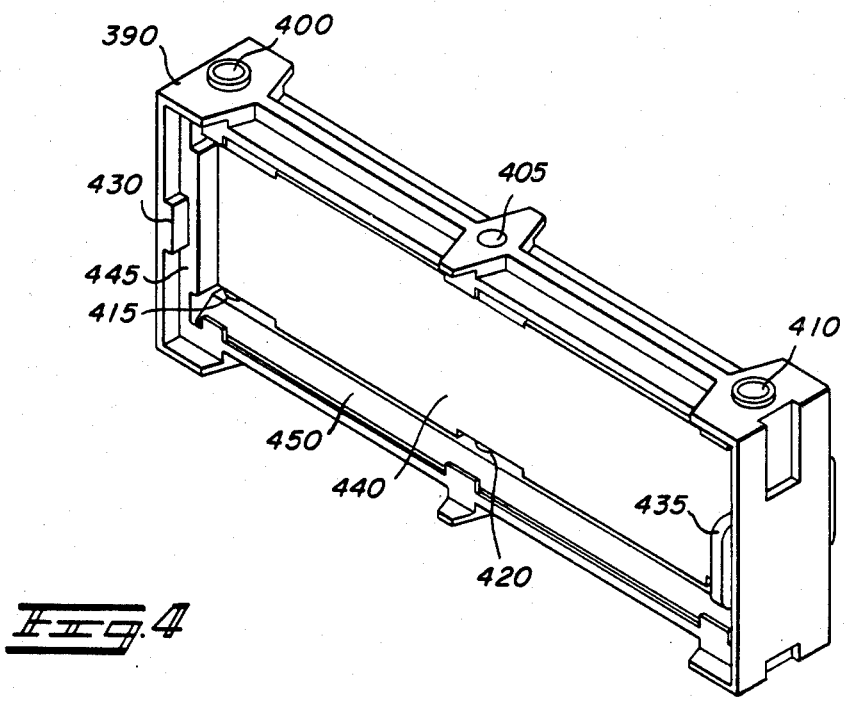
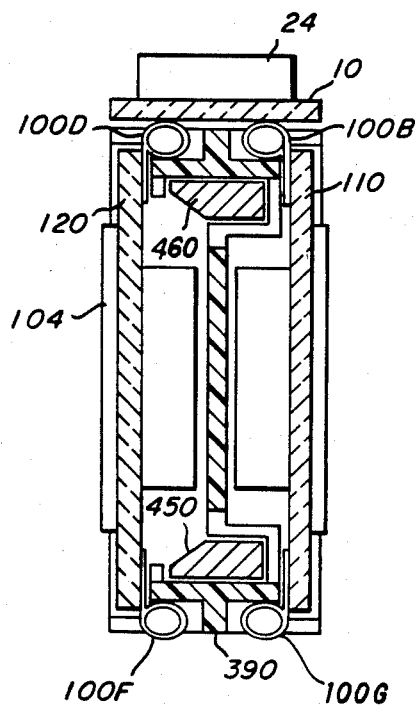

FREQUENCY DETERMINING APPARATUS FOR A SYNTHESIZED RADIO

BACKGROUND OF THE INVENTION

This invention relates to apparatus for controlling the frequency of operation of a radio frequency receiver, and more particularly to apparatus for containing information designating the frequency of operation of a synthesized radio frequency receiver.

DESCRIPTION OF THE PRIOR ART

In the past, discrete crystals have been employed to control the operating frequency of radio frequency receivers. In such conventional receivers, a separate crystal was required for each received or transmit frequency desired. Thus, if operation on a large number of frequency channels was desired, a correspondingly large number of crystals were employed at considerable cost.

As technology progressed, discrete crystals were gradually replaced by discrete channel elements, that is, crystals packaged in conjunction with temperature compensation circuitry resulting in a more stable crystal performance. Of course, such channel elements tend to be more expensive than mere crystals and thus the cost of transceivers with the capability of transmitting and receiving on a relatively large number of frequencies was correspondingly increased.

The offset type radio frequency synthesizer is one type of synthesizer which reduces the number of crystals required to transmit and receive on a large number of frequencies. The offset type synthesizer employs a voltage controlled oscillator, a phase lock loop, and a phase detector circuit all appropriately coupled together to generate a plurality of transmit and receive frequencies from a single reference oscillator. A single crystal in the reference oscillator circuit may be employed to generate the plurality of radio frequency transmit and receive frequencies and thus, the number of crystals employed is extremely minimal. Unfortunately, although such offset type frequency synthesizer is capable of generating a large number of transmit and receive frequencies, such generated frequencies are typically limited to a relatively narrow band, for example 144 through 148 MHz.

Accordingly, one object of the present invention is to provide a frequency control element for enabling a frequency synthesizer to generate transmit and receive frequencies over a relatively wide range of frequencies, for example, 134 through 176 MHz.

Another object of the present invention is to provide a frequency control element into which information is programmed which designates the frequency of operation of a synthesized radio frequency receiver.

These and other objects of the invention will become apparent to those skilled in the art upon consideration of the following description of the invention.

BRIEF SUMMARY OF THE INVENTION

The present invention is directed to providing an apparatus for containing information designating the frequency of operation of a synthesized radio frequency receiver.

In accordance with one embodiment of the invention, such apparatus includes a multilayer circuit board including upper and lower boards and at least one intermediate board disposed therebetween in sandwich-like relationship. The upper and lower circuit boards include exterior surfaces. A memory is situated on the exterior surface of the upper board for providing frequency data to a multibit output port of the memory when a multibit input port of the memory is appropriately addressed. Connecting members are situated on the surfaces of the first and second boards and the at least one intermediate board. The connecting members electrically connect a plurality of electrical contact pads situated on the exterior surface of the lower board to at least the input and output ports. A plurality of interconnecting members are situated on the exterior surfaces of the lower board. The interconnecting members selectively electrically interconnect a portion of a first circuit external to the apparatus to a portion of a second circuit external to the apparatus.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DESCRIPTION OF THE DRAWINGS

FIG. 2D is a top view of the electrically conductive layer situated below the electrically conductive layer of FIG. 2C.

FIG. 3 is an exploded perspective view of the apparatus of the present invention shown in an appropriate position for connection to associated external circuitry.

FIG. 4 is a perspective view of the support member employed to facilitate mounting of the apparatus of the present invention to external circuitry.

FIG. 5 is a cross section of the structures shown in FIG. 3 after such structures are assembled together.

DETAILED DESCRIPTION OF THE PREFERRED EMBODIMENT

Figure 1:
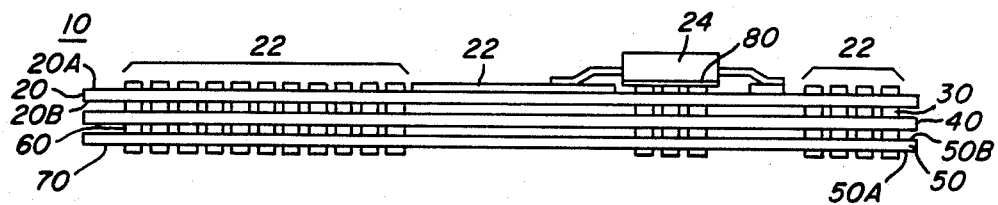
FIG. 1 is a side view of the apparatus of the present invention showing the multilayer nature thereof.

FIG. 1 illustrates one embodiment of the information containing and transferring apparatus of the present invention as apparatus 10. Apparatus 10 includes a layer 20 of electrically insulative material, for example, glass epoxy resin, such as the commercially available FR4. A layer 22 of electrically conductive material, for example, gold coated copper or nickel, is situated on an upper surface 20A of substrate 20. Layer 22 exhibits the predetermined geometric pattern shown in FIG. 2A in one embodiment thereof. A 256×8 programmable read only memory 24 is situated on upper surface 20A and is appropriately coupled to the conductive runners of layer 22 such that data relating to the desired frequency of operation of the synthesizer is supplied to memory 24 and is addressably derivable therefrom in a manner subsequently described in more detail.

Figure 2A:
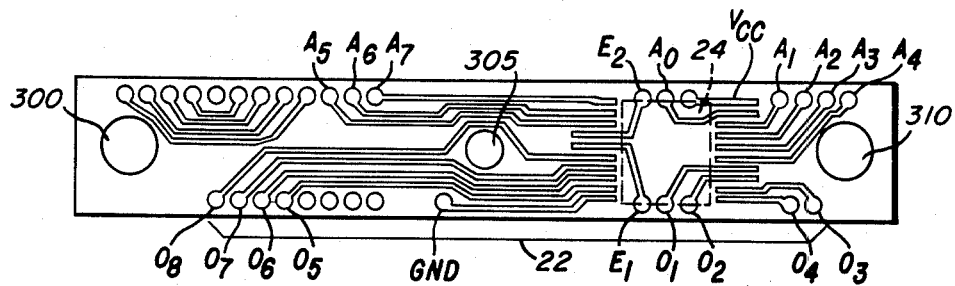
FIG. 2A is a top view of the upper most layer of the apparatus of FIG. 1.
Figure 2B:
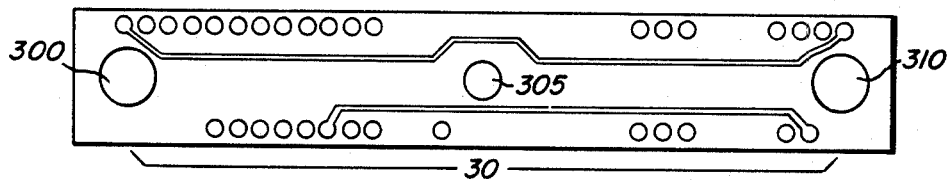
FIG. 2B is a top view of the conductive layer situated below the conductive layer of FIG. 2A.

A layer 30 of electrically conductive material exhibiting the geometric pattern shown in FIG. 2B is situated on the bottom surface 20B of apparatus 10 of FIG. 1

Figure 2C:
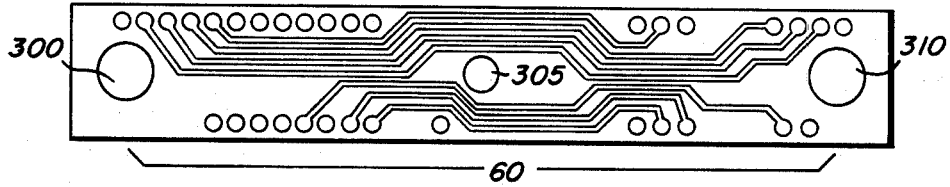
FIG. 2C is a top view of the electrically conductive layer situated below the electrically conductive layer of FIG. 2B.

A layer of insulative substrate material 40 is situated below layer 30 as shown in FIG. 1. Layer 40 exhibits physical properties similar to those of layer 20 and is typically comprised of like materials. A layer 50 of electrically insulative substrate material is situated below layer 40 in the manner shown in FIG. 1. Layer 50 includes upper surface 50A and lower surface 50B. A layer 60 of electrically conductive material exhibiting the geometric pattern depicted in FIG. 2C is situated between surface 50B and substrate layer 40 as shown in FIG. 1. A layer of electrically conductive material 70 exhibiting the geometric pattern shown in FIG. 2D is situated on surface 50A as shown in FIG. 1. Heat activated epoxy layers (not shown) are situated between layers 20, 40 and 50 to hold such layers together in a fixed relationship.

A layer of electrically insulative material is situated between memory 24 and the portions of electrially conductive layer 22 situated therebelow as in FIG. 1 to prevent undesired shorting of the memory 24 to such portions of conductive layer 22.

To more fully appreciate the apparatus 10 of the present invention, it is helpful to examine the following co-pending U.S. patent applications which are assigned to the instant assignee:

Battery Saving System for a Frequency Synthesizer, Ser. No. 251,558, Apr. 6, 1981;
Voltage Converter for a Frequency Synthesizer, Ser. No. 251,559, Apr. 6, 1981;
Priority Channel System for a Synthesizer Transceiver, Ser. No. 251,565, Apr. 6, 1981;
Digital and Analog Phase Detector for a Frequency Synthesizer, Ser. No. 251,570, Apr. 6, 1981;
Range Control Circuit for a Frequency Synthesizer, Ser. No. 251,572, Apr. 6, 1981;
Multiposition Switch with Minimum Interconnections, Ser. No. 251,640, Apr. 6, 1981;
Zone Switching System for a Frequency Synthesizer Transceiver, Ser. No. 251,644, Apr. 6, 1981;
Carrier Modulation System for a Frequency Synthesizer, Ser. No. 251,645, Apr. 6, 1981;
Transmit Security System for a Synthesized Transceiver, Ser. No. 251,657, Apr. 6, 1981;
Improved Swallow Counter for a Frequency Synthesizer, Ser. No. 251,658, Apr. 6, 1981;

The contents of all of the above cited patent applications are incorporated herein by reference.

Understanding the structure and operation of apparatus 10 is facilitated by an examination of the individual portions of the conductive layer 70 shown in the bottom of apparatus 10 of FIG. 2D as viewed from on surface 50A. For convenience, the bottom apparatus surface shown in FIG. 2D is divided into four sub-regions or contact subportion regions (90A, 90B, 90C, and 90D) as shown. Portions of electrically conductive layer 70 extend into sub-regions 90A–90D as shown. Referring momentarily to FIG. 3, electrical connections are established to such portions of conductive layer 70 extending into regions 90A–90D by respective Ampliflex connectors, 100A, 100B, 100C, and 100D which are situated in contact therewith. (Ampliflex is a trademark of Amp, Inc.). It is seen that Ampliflex connectors 100A and 100B are mechanically and electrically connected to portions of an electrical circuit 110 which is external to apparatus 10. In a similar manner, Ampliflex connectors 100C and 100D are electrically and mechanically connected to a circuit 120 external to apparatus 10. It is noted that Ampliflex connectors include a plurality of parallel, but spatially separated metallic conducting members situated on a somewhat cylindrically shaped elastomeric structure. Apparatus 10 is operatively mounted on Ampliflex connectors 100A, 100B, 100C, and 100D such that electrical connections are achieved between the portions of electrically conductive layer 70 extending into sub-regions 90A, 90B, 90C, and 90D with connectors 110A, 100B, 100C, and 100D, respectively. Therefore, more specifically, the portions of electrically conductive layer 70 extending into regions 90A and 90B are electrically connected via Ampliflex connectors 100A and 100B to external circuit 110. In a similar manner, the portions of layer 70 extending into sub-regions 90C and 90D are electrically connected via Ampliflex connectors 100C and 100D, respectively, to external circuit 120. In one embodiment of the present invention, external circuits 110 and 120 are respectively phase detector and controller hybrid board portions of a frequency synthesized radio receiver. Such phase detector and controller hybrids are discussed in detail in the above-cited co-pending patent applications.

As seen in FIG. 2D, layer 70 of apparatus 10 includes interconnecting members 130 and 140 each extending from contact sub-region 90A to contact sub-region 90C. More specifically, interconnecting members 130 and 140 each include opposed ends, one end of each member being situated within region 90A and the remaining end being situated within region 90C. Thus, when apparatus 10 is situated in contact with Ampliflex connectors 110 and 120 in the manner of FIG. 3, interconnecting member 130 selectively couples electrical energy received from the particular portion of Ampliflex connector 100A on circuit 110 in contact therewith to the portion of Ampliflex connector 100C on circuit 120 in contact therewith. In this manner, electrical pulses such as those designated multiplex enable pulses $N_P$ in the cited co-pending applications are selectively coupled between portions of circuit 110 and circuit 120. In a like manner, the portion of Ampliflex connector 100A in contact with interconnecting member 140 and the portion of Ampliflex connector 100C in contact with interconnecting member 140 are selectively electrically coupled together. Thus, a portion of circuit 110 selectively electrically coupled to a portion of circuit 120 via interconnecting member 140 situated on apparatus 10. In this manner, electrical pulses such as multiplex enable pulses N as described in the above-cited patent applications are coupled between appropriate portions of circuits 110 and 120 via interconnecting member 140.

Referring again to FIG. 2D, layer 70 includes a plurality of electrically conductive contact pads 151, 152, . . . 158 situated extending into contact sub-region 90C. Contacts 151-158 are designated "address contacts". These eight (8) address contacts 151,152, . . . 158 are respectively electrically connected to the eight (8) address input contacts or runners $A_0, A_1, \ldots A_7$ of memory 24 of FIG. 2A via the appropriate connecting members of layers 22 of FIG. 2A, layer 30 of FIG. 2B, and layer 60 of FIG. 2C and layer 70 of FIG. 2D. Contacts $A_0, A_1, \ldots A_7$ form the multibit address input port of memory 24. The precise connections made between address contacts 151-158 to such 8 bit multibit input port of memory 24 are shown in detail in examination of these drawings FIG. 2A-FIG. 2D.

Referring again to FIG. 2D, layer 70 includes a plurality of electrically conductive contact pads 161, 162 . . . 168 situated extending into contact sub-region 90A. Such contact pads are designated "frequency information contacts". Contact pads 161,162, . . . 168 are respectively electrically connected to the eight (8) frequency information output contacts or runners $O_1, O_1, \ldots O_8$ of memory 24 of FIG. 2A via appropriate portions of layer 22 of FIG. 2A, layer 30 of FIG. 2B, layer 60 of FIG. 2C, and layer 70 of FIG. 2D as clearly seen in such drawings. Contacts $O_1, O_2, \ldots O_8$ form the multibit frequency information output port of memory 24. The precise connections made between frequency information contacts 161,162, . . . 168 to such 8 bit multibit output port are shown in detail in examination of these drawings FIG. 2A-FIG. 2D. It is noted that contact pads 161-168 extend into connection region 90A in a manner whereby pads 161-168 are vertically aligned with pads 151-158 as seen in FIG. 2D.

To better understand the operation and structure of apparatus 10, it is helpful to examine the same when apparatus 10 is situated such that pads 161-168 and 151-158 are in contact with respective Ampliflex connectors 100A and 100C. Under these conditions, circuit 120 provides a digital 8-bit address signal to the multibit input port of memory 24 via the Ampliflex connector 100C, conductive pads 151-158, and the connecting members of layers 70, 60, 30, and 22 situated therebetween. It is noted that in some embodiments of the invention, less than all of address pads 151-158 are employed to convey address information to memory 24. Memory 24 includes a look-up table of frequency information. More specifically, a different piece of frequency information is stored at each address of memory 24. Thus, when circuit 120 while functioning as part of a frequency synthesizer sends a particular address to the multibit input port of memory 24 in the above described manner, digital indicia of the frequency corresponding to such address are provided to the multibit output port of memory 24. Such frequency information travels from the multibit output of memory 24 through layers 22, 30, 60, and 70, to frequency outputs 161-168, through Ampliflex connector 100A to circuit 110 where such information may be employed for frequency synthesis purposes.

Layer 70 includes frequency source interconnects 170 and 172. Interconnects 170 and 172 are situated extending from connection sub-region 90A to connection sub-region 90C in a spatially parallel relationship. Shorting bars 173 and 174 connect frequency interconnects 170 and 172 together at the opposed ends thereof such that a low resistance path is provided between the opposed ends thereof. Thus, when apparatus 10 is situated in contact with Ampliflex connectors 100A and 100C in the manner of FIG. 3, a reference frequency signal, for example 50 kHz, is fed between board 120 and board 110 via Ampliflex connectors 100A and 100C and interconnect structure 170-172 which contacts each of such Ampliflex connectors.

Referring again to FIG. 2D, layer 70 includes an electrically conductive connection pad 180 extending into connection sub-region 90A. Connection pad 180 is connected to ground when situated in contact with Ampliflex connector 100A in the manner of FIG. 3. Further, contact pad 180 is electrically coupled to and provides ground to an appropriate terminal of memory 24. To accomplish this, connecting pad 180 is connected to a ground terminal of memory 24 by appropriate portions (designated GND in FIG. 2A) of layer 22, layer 30, layer 60, and layer 70 in the manner seen in the multi-layer structure depicted in FIGS. 2A-2D.

Layer 70 of FIG. 2D includes a supply voltage interconnect 190 having three (3) parallel strips of electrically conductive material 191, 192, and 193, each with opposed ends situated in connection sub-regions 90B and 90D. Shorting bars 194 and 195 respectively electrically connect the ends of bars 191, 192, and 193 situated on region 90B together and the ends of bars 191, 192, and 193 situated on sub-region 90B together. Thus, a relatively low resistance path is provided between the opposed ends of the component bars of voltage interconnect structure 190 such that when the opposed ends of the bars of interconnect structure 190 are respectively brought into contact with Ampliflex connectors 100B and 100D in the manner of FIG. 3, a supply voltage signal, for example 5.2 Volts, is provided from one of boards 120 and 110 to the other. Layer 70 includes floating contacts 200 and 201 respectively situated in connection sub-regions 90B and 90D as shown in FIG. 2D. Although shown in FIG. 2D, pads 200 and 201 remain electrically floating to allow versatility in future applications of apparatus 10.

Layer 70 further includes dual, coupled together contacts 210 situated in contact sub-region 90B adjacent floating contact 201. Contacts 210 are connected to a programming enable input terminal (designated $E_1$, in FIG. 2A) of memory 24 via connecting runners of layer 22, layer 30, layer 60 and layer 70 as shown in FIGS. 2A through 2D. Application of an appropriate signal to dual contacts 210 permits programming memory 24 with desired frequency information at selected addresses thereof. Layer 70 further includes dual, coupled together electrical contacts 211 situated extending within contact sub-region 90D adjacent floating contact 200. Dual contacts 211 are coupled to each other and to the enable terminal of memory 24 via appropriate portions of layers 22, 30, 60, and 70 as shown in FIGS. 2A through 2D.

Layer 70 further includes a memory enable interconnect 220. Memory enable interconnect 220 is a bar of electrically conductive material including opposed ends. One end of memory enable interconnect 220 is situated extending into contact sub-region 90B adjacent dual contact 210 and the remaining end of memory enable interconnect 220 is situated extending into contact sub-region 90D adjacent dual contact 211. Thus, when apparatus 10 is situated such that interconnect 220 is in contact with Ampliflex connectors 100B and 100D in the manner suggested by FIG. 3 (discussed later in detail), an electrical interconnection is provided between circuits 110 and 120. This interconnection may be employed to provide information from circuit 110 to circuit 120 to energize a high current regulator on one of such circuits such that sufficient current may be generated to turn on memory 24. It is noted that memory enable interconnect 220 is itself electrically connected to a memory enable contact pad (designated $E_2$, in FIG. 2A) of memory 24 via connecting members or runners of layer 22, layer 30, layer 60 and layer 70 as shown in FIGS. 2A-2D. The operation of memory enable interconnect 220 should be considered in conjunction with supply voltage interconnect 230 situated adjacent thereto as shown in FIG. 2D. Supply voltage interconnect 230 is a bar of electrically conductive material having opposed ends, one end of which is situated extending into contact sub-region 90D. The remaining opposed end of supply voltage interconnect 230 extends into contact sub-region 90D. Supply voltage interconnect 230 tranfers voltage from circuit 110 to 120 or vice versa. More specifically, in this embodiment, voltage interconnect 230 connects 5.2 Volts, from circuit 110 to circuit 120 at one of two selected power levels determined by the state of information flowing though memory enable 220. For example, if circuits 110 and 120 have a significant amount of CMOS sub-circuits, their power requirements are relatively low under quiescent operating conditions. However, when it is desired to enable memory 24 with addresses for the purpose of reading frequency information contained at such addresses, then it is appreciated that a significantly greater amount of power is required for operation of associated circuitry and memory 24 than under quiescent operating conditions. Thus, when information travels between boards 110 and 120 via memory enable interconnect 220 to indicate that the memory is about to be turned on such that additional power is required, one of boards 110 and 120 includes appropriate circuitry to boost the power available at supply voltage interconnect 230. It is noted that supply voltage interconnect 230 is itself electrically connected to a supply voltage contact (designated $V_{cc}$ FIG. 2A) for memory 24 to supply voltage thereto via members or runners of layer 22, layer 30, layer 60 and layer 70 as shown in FIGS. 2A-2D.

Apparatus 10, and more specifically, layer 70 includes a time out timer structure 240. Time out structure includes electrical contact pads 241, 242, and 243 situated within sub-region 90B as seen in FIG. 2D. Contact 241 is electrically connected to contact 242 via a shorting bar 245. Contact 242 is electrically connected to contact 243 via a shorting bar 246. Time out timer structure 240 further includes contact pads 250, 251, 252, and 253 all situated in contact sub-region 90D. Electrical contacts 251, 252, and 253 are vertically aligned with contacts 241, 242, and 243. Contact 252 is connected to contact 253 via a shorting bar 254. Contact 241 is electrically connected to contact 251 via a shorting bar 255 therebetween such that the combined structure of contact 241, shorting bar 255 and contact 251 form time out timer interconnect 260. Contact 243 is electrically connected to contact 253 via a shorting bar 256 situated therebetween such that the combined structure of contact 243 shorting bar, and contact 253 forms time out timer interconnect 270. The presence or absence of time out interconnects 260 and 270 (more specifically, shorting bars 255 and 256, respectively) is employed to instruct a time out timer located on one or both of circuits 110 and 120 whether or not to turn off a transmitter associated with a receiver within a particular preselected amount of time. More particularly, if shorting bar 255 of interconnect 260 and shorting bar 256 of interconnect 270 are present, then, no time out feature is provided by associated circuits 110 and 120. Similarly, no time out feature is provided by circuits 110 and 120 if shorting bar 255 is cut such that contact 241 and 251 are not electrically coupled to each other and if at the same time shorting bar 256 of interconnect 270 remains present and uncut. However, when shorting bar 255 of interconnect 260 is present and uncut such that contact 241 and 251 are connected to each other and shorting bar 256 of interconnect 270 is cut such that contact 243 and 253 are not connected to each other, then, a 60 second time out feature for example, will be provided by the circuitry on boards 110 or 120. However, when shorting bar 255 of interconnect 260 is cut such that contacts 241 and 251 are electrically disconnected from each other and when shorting bar 256 of interconnecting member 270 is cut such that electrical contact 243 and 253 are not electrically coupled together, then circuits 110 and 120 provide a 30 second time out feature, for example.

As seen in FIGS. 2A-2D, and FIG. 3, apparatus 10 is provided with three (3) holes —300, 305 and 310—for purposes of mounting to an external protective cover (not shown) and for purposes subsequently discussed.

FIG. 3 is an exploded perspective view of apparatus 10 shown in position to be mounted to an assembly including external circuits 110 and 120 and support structure 390. Circuits 110 and 120 are shown as hybrid module boards and will henceforth be referred to as hybrid modules 110 and 120. As seen in FIG. 3 and in more detail in FIG. 4, support structure 390 is I beam-like shaped and includes a recessed portion 440 for receiving hybrid module 120 therein. Support structure 390 includes a ridge or rim 445 which module 120 is disposed. Support 390 further includes a protrusion 430 and a spring member 435 situated on rim 445 at opposite ends of support 390 such that module 120 is held in position in support 390 by having its ends relatively gently squeezed between protrusion 430 and spring 435 in the manner suggested by FIG. 3. To summarize, module 120 snaps into place when situated on rim 445 between protrusion 430 and spring member 435. Those skilled in the art will appreciate that module 110 is held to support structure 390 in the same manner as module 120 described above except that module 110 is mounted to the back side of structure 390 not shown in FIG. 3, but clearly shown in the cross section of FIG. 3 along line 5—5 depicted in FIG. 5.

Referring again to FIG. 3, support structure 390 includes threaded holes 400, 405, and 410 respectively vertically aligned with holes 300, 305 and 310, situated in apparatus 10 as shown. Screws inserted in the hole pairs thus formed are employed to mount apparatus 10 on the assembly formed by support structure 390 and modules 110 and 120 affixed thereon as previously described. In this configuration, modules 110 and 120 are electrically coupled to appropriate interconnects (such as 230, for example) and connection points (such as contact pads 161-168, for example) by Ampliflex connectors 100A, 100B, 100C and 100D.

Referring now to FIG. 4 in conjunction with FIG. 3, it is seen that support structure 390 includes rail-like metallic subsupport members or screw plates 450 and 460 running along the inner lengths of support structure 390 as shown to provide structural integrity thereto. Threaded holes 400, 405 and 410 extend into upper screw plate 460 to facilitate mounting of apparatus 10 to support structure 390. Threaded holes 415, 420 and a third hole (not shown for convenience of perspective drawing, but vertically aligned with hole 410) extend into lower screw plate 450 to facilitate mounting the assembly of apparatus 10, support structure 390 with modules 110 and 120 situated therein to a mother circuit board. As seen partially in FIG. 3 and FIG. 5, electrical connections between such assembly is achieved at Ampliflex connectors 100E and 100F on module 120 and Ampliflex connector 100G on module 110. (Another Ampliflex connection on module 110 which is not shown is employed to achieve more of such electrical connections.)

The foregoing describes an apparatus for containing information designating the frequency of operation of a synthesized radio frequency receiver in a programmable manner. The apparatus of the invention provides for synthesized radio operation over a relatively wide range of radio frequencies.

While only certain preferred features of the invention have been shown by way of illustration, many modifications and changes will occur to those skilled in the art. It is, therefore, to be understood that the present claims are intended to cover all such modifications and changes as fall within the true spirit of the invention.

We claim:

1. An apparatus for containing information designating the frequency of operation of a synthesized radio frequency transceiver comprising:
    a multilayer circuit board including upper and lower boards and at least one intermediate board disposed therebetween in sandwich-like relationship, said upper and lower circuit boards including exterior surfaces;
    memory means, situated on the exterior surface of said upper board, for providing frequency data to a multibit output port of said memory means, when a multibit input port of said memory means is appropriately addressed;
    connecting means, situated on the surfaces of said first and second boards and said at least one intermediate board, for electrically connecting a plurality of electrical contact pads situated on the exterior surface of said lower board to at least said input and output ports;
    jumper means, situated on said exterior surface of said lower circuit board, coupling certain of said electrical contact pads together, said jumper means being selectively cuttable to control certain predetermined characteristics of the operation of said transceiver; and
    a plurality of interconnecting means, situated on the exterior surface of said lower board, for selectively electrically interconnecting a portion of a first circuit external to said apparatus to a portion of a second circuit external to said apparatus.

2. The apparatus of claim 1 wherein said memory means comprises a programmable read only memory.

3. The apparatus of claim 1 wherein each of said interconnecting means includes an electrically conductive member having opposed ends, each of said opposed ends being adapted to contact a portion of first and second Ampliflex-type connectors respectively, said first and second Ampliflex-type connectors being electrically coupled to said first and second circuits, respectively.

4. The apparatus of claim 1 wherein said connecting means includes electrically conductive members situated throughout said circuit board on the respective surfaces thereof to connect address contact pads included in said electrical contact pads to respective address input contacts included in the multibit input port of said memory means.

5. The apparatus of claim 1 wherein said connecting means includes electrically conductive members situated throughout said circuit board on the respective surfaces thereof to connect frequency information contact pads included in said electrical contact pads to respective frequency information output contacts included in the multibit output port of said memory means.

6. The apparatus of claim 1 wherein said interconnecting means includes at least one time out interconnecting member of electrically conductive material having opposed ends, said at least one time out interconnecting member selectively engaging a time out circuit included in said first and second circuits.

7. The apparatus of claim 1 including heat activated epoxy layers situated between said boards to hold said boards together in a fixed relationship.

8. The apparatus of claim 1 wherein said first and second circuits include first and second hybrid modules mechanically held in fixed relation with respect to each other and said multilayer circuit board by a support member situated between said first and second hybrid modules.

9. A packaging arrangement for electronic apparatus, comprising:
    a support structure having first and second sides;
    a first circuit module having an upper edge and a lower edge and mechanically attached to the first side of said support structure;
    a second circuit module having an upper edge and a lower edge and mechanically attached to the second side of said support structure so that said first and second circuit modules are arranged substantially parallel to each other;
    a third circuit module removably situated adjacent the upper edges of said first and second circuit modules in a plane substantially normal to said first and second circuit modules; and
    electrical interconnection means disposed adjacent said upper edges of said first and second circuit modules, for electrically coupling said first and second circuit modules to said third circuit module.

10. The packaging arrangement of claim 9 further including fastening means for removably mechanically fastening said third circuit module to said support structure.

11. The packaging arrangement of claim 9 further including electrical connector means disposed adjacent said lower edges of said first and second circuit modules for electrically communicating with a mother board.

12. An apparatus for containing information designating the frequency of operation of a synthesized radio transceiver, said transceiver including a support structure sandwiched between first and second circuit modules to hold said circuit modules in a fixed and substantially parallel relationship with each other, said first and second circuit modules having upper edges with Ampliflex-type connectors attached adjacent said upper edges, said apparatus comprising:
    a multilayer circuit board including upper and lower surfaces;
    a programmable read only memory disposed on said upper surface for providing frequency data to a multibit output port of said read only memory when an appropriate multibit input port of said read only memory is appropriately addressed;
    a pluraltity of contact pads disposed on said lower surface of said multilayer circuit board and arranged so as to contact said Ampliflex-type connectors when the lower surface of said multilayer circuit board is appropriately urged into intimate contact with said upper edges of said first and second circuit modules to make electrical connection therewith, certain of said contact pads being coupled to said multibit input port and certain of said contact pads being coupled to said multibit output port; and
    a plurality of electrical conductors coupling together certain of said contact pads which are not coupled to either said multibit input port or said multibit output port so that said first and second circuit modules may be electrically coupled together through said multilayer circuit board.

* * * * *